United States Patent
Bour et al.

(10) Patent No.: US 9,076,827 B2
(45) Date of Patent: Jul. 7, 2015

(54) TRANSFER CHAMBER METROLOGY FOR IMPROVED DEVICE YIELD

(75) Inventors: David P. Bour, Cupertino, CA (US); Alain Duboust, Sunnyvale, CA (US); Alexey Goder, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 900 days.

(21) Appl. No.: 13/230,573

(22) Filed: Sep. 12, 2011

(65) Prior Publication Data

US 2012/0118224 A1  May 17, 2012

Related U.S. Application Data

(60) Provisional application No. 61/382,835, filed on Sep. 14, 2010.

(51) Int. Cl.
  *C30B 25/16* (2006.01)
  *C30B 25/08* (2006.01)
  (Continued)

(52) U.S. Cl.
  CPC ......... *H01L 21/67196* (2013.01); *Y10T 117/10* (2015.01); *Y10T 117/1008* (2015.01);
  (Continued)

(58) Field of Classification Search
  CPC .......... H01L 21/67196; H01L 21/67248; H01L 22/12; H01L 21/0242; H01L 21/02458; H01L 21/02507; H01L 21/0254; H01L 22/26; H01L 33/007; Y10T 117/10; Y10T 117/1004; Y10T 114/1008; C30B 35/00; G01K 11/20; G01K 2217/00
  USPC .............. 117/201, 86, 85; 118/708, 712, 696, 118/697
  See application file for complete search history.

(56) References Cited

U.S. PATENT DOCUMENTS

| 4,592,306 A | 6/1986 | Gallego |
| 4,763,602 A | 8/1988 | Madan et al. |

(Continued)

FOREIGN PATENT DOCUMENTS

| EP | 0541373 | 5/1993 |
| JP | 07194965 | 8/1995 |

(Continued)

OTHER PUBLICATIONS

Calculation of semiconductor band gaps with the M06-L density functional, Yan Zhao and Donald G. Truhlar, The Journal of Chemical Physics 130, 074103, 2009.*

(Continued)

*Primary Examiner* — Robert M Kunemund
*Assistant Examiner* — Hua Qi
(74) *Attorney, Agent, or Firm* — Blakely Sokoloff Taylor & Zafman LLP (57) ABSTRACT

Apparatus and method for control of epitaxial growth parameters, for example during manufacture of light emitting diodes (LEDs). Embodiments include PL measurement of a group III-V film following growth while a substrate at an elevated temperature is in a transfer chamber of a multi-chamber cluster tool. In other embodiments, a film thickness measurement, a contactless resistivity measurement, and a particle and/or roughness measure is performed while the substrate is disposed in the transfer chamber. One or more of the measurements performed in the transfer chamber are temperature corrected to room temperature by estimating the elevated temperature based on emission from a GaN base layer disposed below the group III-V film. In other embodiments, temperature correction is based on an absorbance band edge of the GaN base layer determined from collected white light reflectance spectra. Temperature corrected metrology is then used to control growth processes.

15 Claims, 10 Drawing Sheets

(51) Int. Cl.
  *C30B 25/10*    (2006.01)
  *C23C 16/06*    (2006.01)
  *C23C 16/52*    (2006.01)
  *H01L 21/67*    (2006.01)
  *G01K 11/20*    (2006.01)
  *H01L 21/66*    (2006.01)
  *H01L 21/02*    (2006.01)
  *H01L 33/00*    (2010.01)

(52) U.S. Cl.
  CPC ......... *Y10T117/1004* (2015.01); *G01K 11/20* (2013.01); *G01K 2217/00* (2013.01); *H01L 21/0242* (2013.01); *H01L 21/02458* (2013.01); *H01L 21/02507* (2013.01); *H01L 21/0254* (2013.01); *H01L 21/67248* (2013.01); *H01L 22/12* (2013.01); *H01L 22/26* (2013.01); *H01L 33/007* (2013.01)

(56) References Cited

U.S. PATENT DOCUMENTS

| | | | |
|---|---|---|---|
| 5,376,580 | A | 12/1994 | Kish et al. |
| 5,658,418 | A * | 8/1997 | Coronel et al. ......... 156/345.25 |
| 5,686,738 | A | 11/1997 | Moustakas |
| 5,855,675 | A | 1/1999 | Doering et al. |
| 6,309,465 | B1 | 10/2001 | Jurgensen et al. |
| 6,391,748 | B1 | 5/2002 | Temkin et al. |
| 6,492,625 | B1 | 12/2002 | Boguslavskiy et al. |
| 6,551,848 | B2 | 4/2003 | Kwak et al. |
| 6,569,765 | B1 | 5/2003 | Solomon et al. |
| 6,630,689 | B2 | 10/2003 | Bhat et al. |
| 6,632,725 | B2 | 10/2003 | Trassoudaine et al. |
| 6,692,568 | B2 | 2/2004 | Cuomo et al. |
| 6,787,435 | B2 | 9/2004 | Gibb et al. |
| 6,849,241 | B2 | 2/2005 | Dauelsberg et al. |
| 6,964,876 | B2 | 11/2005 | Heuken |
| 7,122,844 | B2 | 10/2006 | Nakamura et al. |
| 7,130,762 | B2 | 10/2006 | Hellig et al. |
| 7,159,599 | B2 | 1/2007 | Verhaverbeke et al. |
| 7,275,861 | B2 | 10/2007 | Volf et al. |
| 7,327,036 | B2 | 2/2008 | Borghs et al. |
| 7,368,368 | B2 | 5/2008 | Emerson |
| 7,452,125 | B2 | 11/2008 | Volf et al. |
| 7,611,915 | B2 | 11/2009 | Slater, Jr. et al. |
| 7,682,952 | B2 | 3/2010 | Isaacson et al. |
| 7,759,670 | B2 | 7/2010 | Liu et al. |
| 7,829,442 | B2 | 11/2010 | Westhoff et al. |
| 7,838,315 | B2 | 11/2010 | Yang et al. |
| 2002/0011599 | A1 | 1/2002 | Motoki et al. |
| 2003/0010978 | A1 | 1/2003 | Burden |
| 2005/0199883 | A1 | 9/2005 | Borghs et al. |
| 2006/0032848 | A1 | 2/2006 | Lee et al. |
| 2006/0040475 | A1 | 2/2006 | Emerson |
| 2006/0054987 | A1 | 3/2006 | Nii |
| 2006/0174815 | A1 | 8/2006 | Butcher et al. |
| 2007/0190757 | A1 | 8/2007 | Nakamura et al. |
| 2007/0240631 | A1 | 10/2007 | Nijhawan et al. |
| 2007/0260422 | A1 * | 11/2007 | Marcus et al. ................. 702/172 |
| 2008/0092819 | A1 | 4/2008 | Bour et al. |
| 2008/0105881 | A1 | 5/2008 | Kim et al. |
| 2008/0124453 | A1 | 5/2008 | Bour et al. |
| 2008/0124817 | A1 * | 5/2008 | Bour et al. ......... 438/7 |
| 2008/0272463 | A1 | 11/2008 | Butcher et al. |
| 2008/0282978 | A1 | 11/2008 | Butcher et al. |
| 2008/0308829 | A1 | 12/2008 | Liu et al. |
| 2009/0020768 | A1 | 1/2009 | Butcher et al. |
| 2009/0149008 | A1 | 6/2009 | Kryliouk et al. |
| 2010/0032647 | A1 | 2/2010 | Khan et al. |
| 2010/0055318 | A1 | 3/2010 | Volf et al. |
| 2010/0148197 | A1 * | 6/2010 | Bour et al. ......... 257/98 |
| 2010/0210067 | A1 | 8/2010 | Butcher |
| 2010/0264424 | A1 | 10/2010 | Akiyama |
| 2010/0279020 | A1 | 11/2010 | Melnik et al. |
| 2010/0295084 | A1 | 11/2010 | Tu et al. |
| 2010/0295098 | A1 | 11/2010 | Sugimoto et al. |
| 2011/0108796 | A1 | 5/2011 | Wang et al. |

FOREIGN PATENT DOCUMENTS

| | | |
|---|---|---|
| JP | 2005054244 | 3/2005 |
| JP | 2006086177 | 3/2006 |
| JP | 2006114548 | 4/2006 |
| JP | 2007049078 | 2/2007 |
| JP | 2007523261 | 8/2007 |
| JP | 2008184634 | 8/2008 |
| JP | 2009143756 | 7/2009 |
| JP | 2009147375 | 7/2009 |
| KR | 20030094491 | 12/2003 |
| WO | WO-2009099776 | 8/2009 |

OTHER PUBLICATIONS

International Search Report and Written Opinion mailed Jun. 29, 2009 for Application No. PCT/US2009/031831 7 Pages.
International Preliminary Report on Patentability mailed Aug. 3, 2010 for Application No. PCT/US2009/031831 5 Pages.
International Preliminary Report on Patentability mailed Nov. 23, 2010, for Application No. PCT/US2009/031831 5 Pages.
Office Action for Chinese Patent Application No. 200980101679.0 Mailed Jul. 27, 2011, 7 Pages.
International Search Report and Written Opinion for Application No. PCT/US2011/051801 Mailed May 1, 2012, 7 Pages.
International Search Report and Written Opinion for Application No. PCT/US2011/051631 Mailed Apr. 10, 2012, 7 Pages.

* cited by examiner

TRANSFER CHAMBER METROLOGY FOR IMPROVED DEVICE YIELD

CROSS REFERENCE TO RELATED APPLICATIONS

This application claims the benefit of U.S. Provisional Application No. 61/382,835 filed on Sep. 14, 2010, entitled "TRANSFER CHAMBER METROLOGY FOR IMPROVED DEVICE YIELD," the entire contents of which are hereby incorporated by reference in its entirety for all purposes.

BACKGROUND

1. Field

Embodiments of the present invention pertain to the field of automate process control, and in particular, to metrology and control of epitaxially grown material layers in a light emitting diode (LED) film stack.

2. Description of Related Art

Group III-V materials are playing an ever increasing role in the semiconductor device and related, e.g. light-emitting diode (LED), industries. While devices such as LEDs employing multiple quantum well (MQW) structures epitaxially grown on a substrate are a promising technology, epitaxial growth of such structures is difficult because of the very thin material layers formed and the dependence of device properties (e.g., emission wavelength) on the material and physical characteristics of those layers.

The material and/or physical characteristics of an MQW structure are dependent on the growth environment within an epitaxy chamber. Post-manufacture metrology of an LED material stack provides a manufacturing control point which too far downstream to avoid significant yield loss in the event one of the epitaxial growth processes forming the LED stack deviating out of specification. In-situ metrology of an LED material stack however is prohibitive because of the epitaxy chamber and environment therein obscures observation of material properties.

BRIEF DESCRIPTION OF THE DRAWINGS

Embodiments of the present invention are illustrated by way of example, and not by way of limitation, in the figures of the accompanying drawings, in which.

SUMMARY

Light-emitting diodes (LEDs) and other electronic devices may be fabricated from layers of group III-V films. Exemplary embodiments of the present invention relate to the controlling the growth of group III-V and group III-nitride films, such as, but not limited to gallium nitride (GaN) films.

Disclosed herein are apparatuses and method for control of epitaxial growth parameters. In particular embodiments, growth of an LED film stack comprises three separate growth operations, after each of which the substrate passes through a transfer chamber of a multi-chamber cluster tool. Metrology is performed as the substrate passes through the transfer chamber. Embodiments include PL measurement of a group III-V film grown in a first chamber while a substrate is at an elevated (high) temperature. In other embodiments, a film thickness measurement, a contactless resistivity measurement, and a particle and/or roughness measure is performed after growth of a semiconductor base layer over which the group III-V film is grown. Control of the semiconductor growth process is performed by a system controller which modifies growth parameters based on the transfer chamber metrology.

For embodiments, the substrate is at an elevated temperature when measured and one or more of the measurements performed in the transfer chamber are temperature corrected to room temperature by estimating the elevated temperature based on emission from a base layer having a known composition disposed below the group III-V film. In other embodiments, temperature correction is based on an absorbance band edge of the base layer determined from collected white light reflectance spectra.

DETAILED DESCRIPTION

In the following description, numerous details are set forth. It will be apparent, however, to one skilled in the art, that the present invention may be practiced without these specific details. In some instances, well-known methods and devices are shown in block diagram form, rather than in detail, to avoid obscuring the present invention. Reference throughout this specification to "an embodiment" means that a particular feature, structure, function, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the two embodiments are not mutually exclusive.

Disclosed herein are apparatuses and methods for control of epitaxial growth parameters. While a vast range of epitaxial films of differing composition and thicknesses may be grown employing the techniques described herein, light-emitting diodes (LEDs) and devices having multiple quantum well (MQW) structures fabricated from layers of group III-V films are particularly well-suited for certain of the apparatuses and methods. As such, exemplary embodiments of the present invention are described in the context of group III-V and group III-nitride films, such as, but not limited to gallium nitride (GaN) films and MQW structures grown thereon. While the exemplary embodiments serve to illustrate embodiments considered particularly advantageous, the techniques and system described may be readily applied to other material systems and devices.

Figure 1A:
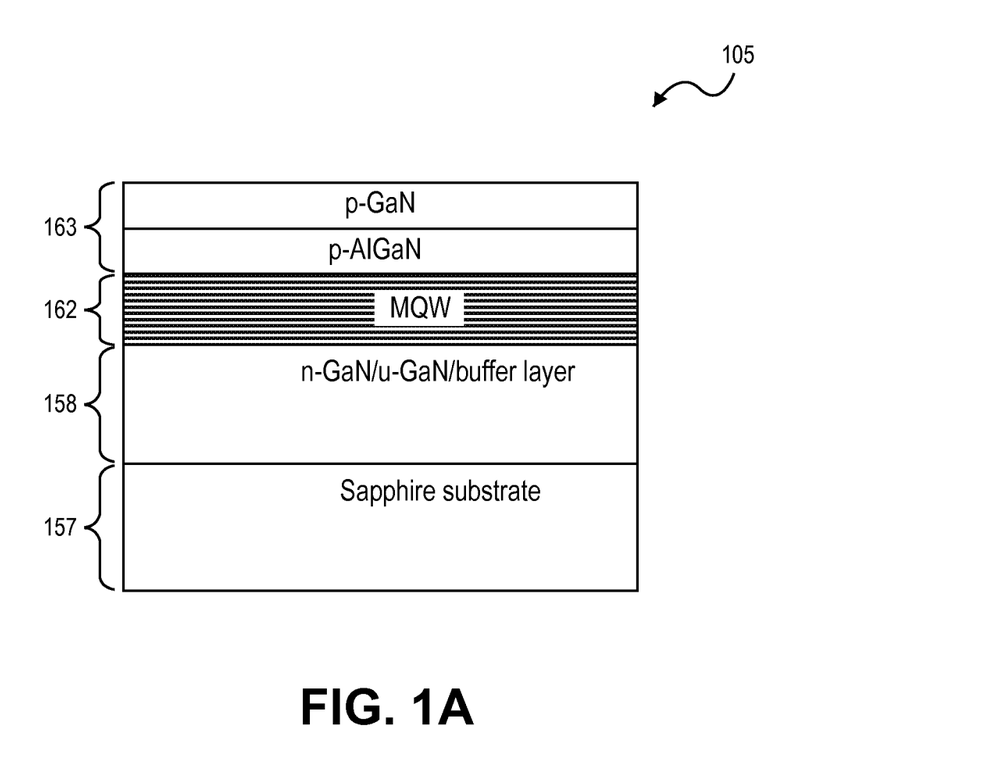
FIG. 1A illustrates a cross-sectional view of a GaN-based LED film stack which is grown using the growth temperature control method depicted in FIG. 1A, in accordance with an embodiment of the present invention.

FIG. 1A illustrates a cross-sectional view of a GaN-based LED film stack which is grown in accordance with an embodiment of the present invention. In FIG. 1A, an LED stack 105 is formed on a substrate 157. In one implementation, the substrate 157 is single crystalline sapphire. Other embodiments contemplated include the use of substrates other than sapphire substrates, such as silicon (Si), germanium (Ge), silicon carbide (SiC), gallium arsenide (GaAs), zinc oxide (ZnO), lithium aluminum oxide ($\gamma$-LiAlO$_2$).

Disposed upon the substrate 157, are one or more semiconductor base layers 158 which may include a III-V material such as any number of group III-nitride based materials, including, but not limited to, GaN, InGaN, AlGaN. The base layer 158 may include a buffer layer which provides either a polar GaN starting material (i.e., the largest area surface is nominally an (h k l) plane wherein h=k=0, and l is non-zero), a non-polar GaN starting material (i.e., the largest area surface oriented at an angle ranging from about 80-100 degrees from the polar orientation described above towards an (h k l) plane wherein l=0, and at least one of h and k is non-zero), or a semi-polar GaN starting material (i.e., the largest area surface oriented at an angle ranging from about >0 to 80 degrees or 110-179 degrees from the polar orientation described above towards an (h k l) plane wherein l=0, and at least one of h and k is non-zero). One or more bottom n-type epitaxial layers are further included in the base layer 158 to facilitate a bottom contact. The bottom n-type epitaxial layers may be any doped or undoped n-type group III-nitride based materials, such as, but not limited to, GaN, InGaN, AlGaN.

As further depicted in FIG. 1A, a multiple quantum well (MQW) structure 162 is disposed over an n-type epitaxial layer of the base layer 158. The MQW structure 162 may be any known in the art to provide a particular emission wavelength at an operating temperature of the LED (e.g., room temperature). In a certain embodiments, the MQW structure 162 includes a group III-V film, which for example, may have a wide range of indium (In) content within GaN. Depending on the desired wavelength(s), the MQW structure 162 may have between about a 10% to over 40% of mole fraction indium as a function of growth temperature, ratio of indium to gallium precursor, etc. It should also be appreciated that any of the MQW structures described herein may also take the form of single quantum wells (SQW) or double heterostructures that are characterized by greater thicknesses than a QW. The base layer 158 and MQW structure 162 may be grown in a metalorganic chemical vapor deposition (MOCVD) chamber or a hydride/halide vapor phase epitaxy (HVPE) chamber, or any deposition chamber known in the art. Any growth techniques known in the art may be utilized with such chambers.

One or more p-type epitaxial layers 163 are disposed over the bottom MQW structure 162. The p-type epitaxial layers 163 may include one or more layers of differing material composition forming a top of the LED stack 105. In the exemplary embodiment, the p-type epitaxial layers 163 include both p-type GaN and p-type AlGaN layers doped with Mg. In other embodiments only one of these, such as p-type GaN are utilized. Other materials known in the art to be applicable to p-type contact layers for GaN systems may also be utilized. The thicknesses of the p-type epitaxial layers 163 may also vary within the limits known in the art. The p-type epitaxial layers 163 may also be gown in an MOCVD or HVPE epitaxy chamber. Incorporation of Mg during the growth of the p-type epitaxial layers 163 may be by way of introduction of Cp$_2$ Mg to the epitaxy chamber, for example.

Additional layers (not depicted), such as, tunneling layers, n-type current spreading layers and further MQW structures (e.g., for stacked diode embodiments) may be disposed on the LED stack 105 in substantially the same manner described for the layers 158, 162 and 163 or in any manner known in the art. Following the growth of the LED stack 105, conventional patterning and etching techniques expose regions of the bottom n-type GaN layers (e.g., top surface of starting material 158) and the p-type epitaxial layers 163. Any contact metallization known in the art may then be applied to the exposed regions to form n-type electrode contact and p-type electrode contacts for the LED stack 105. In exemplary embodiments, the n-type electrode is made of a metal stack, such as, but not limited to, Al/Au, Ti/Al/Ni/Au, Al/Pt/Au, or Ti/Al/Pt/Au. Exemplary p-type electrode embodiments include Ni/Au or Pd/Au. For either n-type or p-type contacts, a transparent conductor, such as Indium Tin Oxide (ITO), or others known in the art, may also be utilized.

Figure 1B:
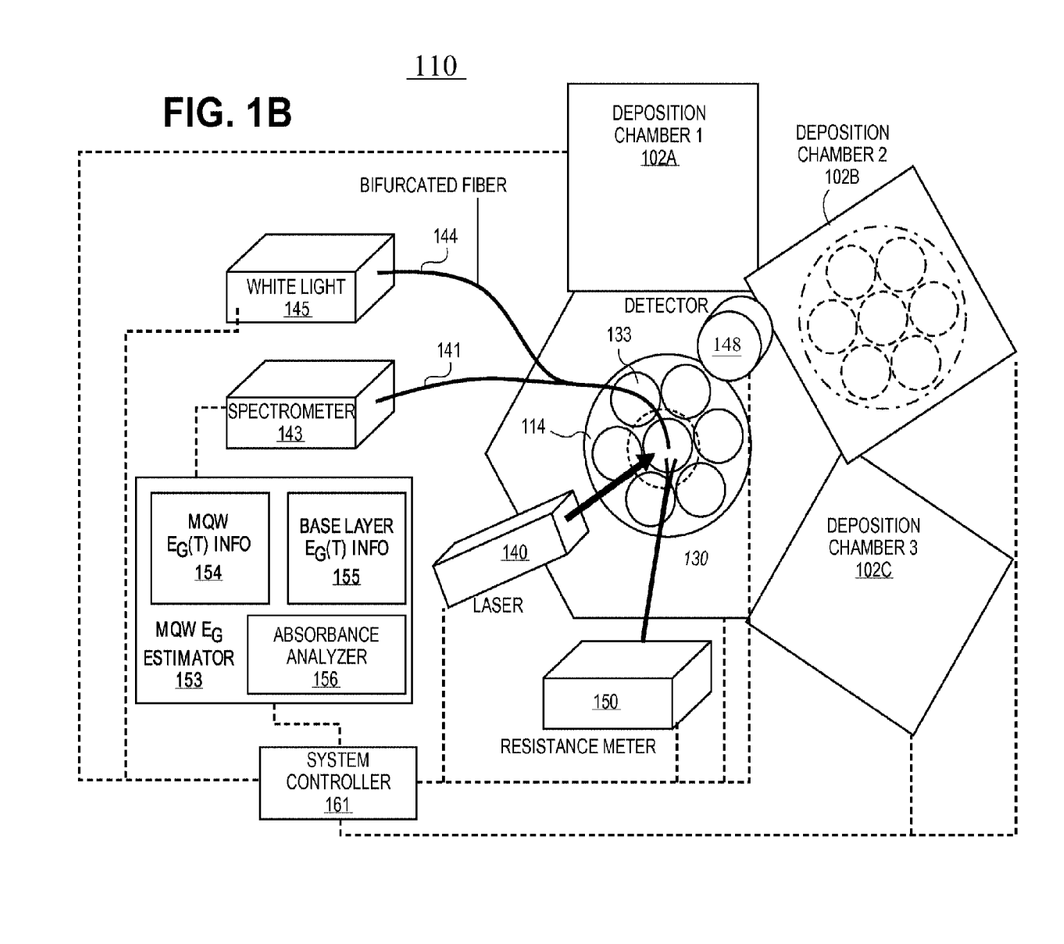
FIG. 1B is a block diagram illustrating a plan view of a multi-chambered cluster tool including transfer chamber metrology, in accordance with an embodiment of the present invention.

FIG. 1B is a block diagram illustrating a plan view of a multi-chambered cluster tool 110 including transfer chamber metrology, in accordance with an embodiment of the present invention. The cluster tool 110 is a modular system comprising multiple process chambers 102 A,B,C that perform various processing steps that are used to form an electronic device stack, such as the LED stack 105. The process chambers 102A,B,C are each coupled to a transfer chamber 130. As used herein, a transfer chamber is a chamber through which a substrate passes en route to a process chamber with no actual film growth or other material processing being performed in the transfer chamber. In the exemplary embodiment, the transfer chamber 130 is between the process chambers 102 A,B,C and load locks (not depicted) through which substrates may be loaded and unloaded, to and from, the cluster tool 110. In embodiments, the transfer chamber 130 has an internal volume which houses a robot (not depicted) that is adapted to transfer substrates 133. The robot supports the substrate carrier 114 which carries one or more substrates 133, and the substrate carrier 114 is transferred between the process chambers 102 A,B,C and batch load locks. It should be noted however, that not all embodiments of a transfer chamber house a robot. A load-lock may also function as a cool-down chamber for the substrates 133 and/or carrier 114. The transfer chamber 130 includes a lid (not depicted) and the internal volume may be maintained at a vacuum condition. In a specific embodiment, the internal volume of the transfer chamber 130 is filled with nitrogen gas and maintained at a pressure of about 20 Torr to about 200 Torr.

In one aspect of the invention, the cluster tool 110 includes a system controller 161 which is adapted to carry out various substrate processing methods and sequences and analyze the processing results as observed by transfer chamber metrology. The multi-chambered cluster tool 110 may be any platform known in the art that is capable of adaptively controlling a plurality of process modules simultaneously. Exemplary embodiments include an Opus™ AdvantEdge™ system or a Centura™ system, both commercially available from Applied Materials, Inc. of Santa Clara, Calif.

In the exemplary embodiment shown in FIG. 1B, three process chambers 102A, 102B and 102C are coupled to the transfer chamber 130, although six or more such process chambers may be coupled to the transfer chamber 130. In the depicted embodiment each of the three process chambers 102A,B,C are configured to perform epitaxial growths of semiconductor films. Each of the deposition chambers may be of any type, such as, but not limited to metal organic chemical vapor deposition (MOCVD) and HVPE chambers. In other embodiments, one or more of the process chambers 102A,B,C is a rapid thermal processing (RTP) chamber for substrate annealing, an epitaxial (EPI) deposition chamber, a chemical vapor deposition (CVD) chamber that is adapted to deposit a metal or dielectric layer, an etch chamber, or a sputtering (PVD) chamber. For the exemplary embodiment, the process chambers 102A,B,C perform particular group III-V growth operations described elsewhere herein on a substrate 133 or batch of substrates disposed on a carrier 114.

Embodiments described herein which utilize an intra-LED stack growth transfer of the substrate between two epitaxy chambers may be performed using the multi-chambered system depicted in FIG. 1B with a metrology operation occurring at least once as the substrate 133 and/or carrier 114 is displaced through the transfer chamber 130 en route between two process chambers or en route to a load lock after processing is completed or terminated.

Fitted to the transfer chamber 130 are one or more metrology tools adapted to measure one or more of thickness, particle and/or surface roughness assessments, temperature, band gap, or resistivity of a deposited film on the surface of the substrate. Optical hardware to perform techniques including ellipsometry, reflectometry, or X-ray photoelectron spectroscopy (XPS) may be fitted to the transfer chamber 130 to perform such measurements between runs of the process chambers 102A,B,C. Similarly, hardware to perform any of X-ray diffraction (XRD), X-ray fluorescence (XRF), X-ray reflectivity (XRR), Auger electron spectrometry (AES), transmission electron microscopy (TEM), atomic force microscopy (AFM), UV Raman spectroscopy, mass spectrometry (e.g., residual gas analyzer), energy dispersive spectroscopy (EDSITEM), photoluminescence (PL) spectroscopy, electroluminescense (EL) spectroscopy (also referred to as flash LED spectroscopy may also be fitted to the transfer chamber 130.

Because many of the observations made by the metrology techniques described herein have a dependence on temperature and because the substrate 133 while in the cluster tool 110 will be at a temperature elevated above room temperature (having been removed from a deposition chamber which typically operates at 400° C. or more), equipment to perform contactless temperature measurements may also be fitted to the transfer chamber 130. For example, in embodiments a pyrometer and/or optical hardware to perform a technique known as band edge thermometry may be fitted to the transfer chamber 130 or another chamber of the cluster tool 110 through which the substrate 133 is made to pass en route between process chambers.

In the exemplary embodiment illustrated in FIG. 1B, the transfer chamber 130 includes a PL apparatus. As shown, a laser light source 140 is coupled to the transfer chamber 130 to illuminate an area of a grown film while the substrate 133 is disposed in the transfer chamber 130. In an embodiment, the excitation laser is disposed outside the transfer chamber 130 to provide excitation through a quartz or sapphire window disposed in a lid or other wall of the transfer chamber 130. The laser light source 140 may be positioned outside of the transfer chamber 130 to illuminate an area of the grown film with incident light. The laser light source 140 may be utilized for both photoluminescence spectroscopy (PL) and a particle/surface roughness assessment. Generally the laser light source 140 may be of any type utilized in the art for PL. In the exemplary embodiment, the laser light source 140 is a cw laser diode which emits at a wavelength absorbed by the semiconductor base layer 158 when the base layer is at the elevated temperatures expected when disposed in the cluster tool 110. For particular embodiments where the base layer 158 includes a GaN layer, the laser light source 140 emits at a wavelength below 405 nm. In particular embodiments, the laser light source 140 emits at a wavelength of at least 360 nm. In a preferred embodiment, the laser light source 140 emits at a wavelength of approximately 375 nm.

Because the substrate 133 is at an elevated temperature and is cooling while it is transferred between process chambers, the substrate 133 can be expected to be warped to various degrees over time. For this reason, the laser light is preferably not a focused beam, but rather a collimated beam having spot size of at least 25 μm and preferably between 50 and 2000 μm. Given collimated beams have a lower energy density than focused beams, it is important that the collimated beam is pumped to have sufficient power to illuminate the spot size at a sufficient energy density to produce an emission signal which can be collected over the noise attributable to the elevated substrate temperature. For the exemplary embodiment having a laser light source 140 emitting at a wavelength of 375 nm and an average power of 15 mW has been found to provide good results. However, the average power may be anywhere between 2 mW and 200 mW, or greater depending on the base layer composition, substrate temperature, and spot size.

As further illustrated in FIG. 1B, a collection fiber 141 penetrates into the transfer chamber 130, for example through the lid. In an embodiment, the collection fiber 141 is a large-core fiber to collect the photoluminescence in an on-axis position, normal to a top surface of the epitaxially grown films being measured. Alternatively, collection optics may be disposed exterior to the transfer chamber 130 to image the PL, but alignment is then made more difficult. For some embodiments where the collection fiber 141 penetrates the transfer chamber 130, all or a subset of the plurality of substrates 133 on the carrier 114 are measured, or mapped by flexing ends of the fibers within the transfer chamber 130. In alternative embodiments, where the collection fiber 141 is fixed or where the collection optics are disposed outside of the transfer chamber 130, motion of the robot arm permits mapping or measurement of representative substrates 133.

The collection fiber 141 is further coupled to a spectrometer 143. The spectrometer 143 may be any utilized in the art for the purpose of collecting PL emission spectra, such as one including a grating and a charged coupled device (CCD) array. In the exemplary embodiment, the spectrometer 143 records spectra over a wavelength range within which both the semiconductor base layer 158 and the MQW structure 162 absorb. More particularly, the spectrometer 143 records spectra over a wavelength range including PL emission bands from both the semiconductor base layer 158 and the MQW structure 162. For the exemplary embodiment where the semiconductor base layer 158 includes GaN and the MQW structure 165 includes InGaN, the spectrometer 143 records spectra between about 300 nm and 800 nm. The fiber coupled spectrometer 143 is disposed exterior the transfer chamber 130 and in the particular embodiment depicted in FIG. 1B, the spectrometer 143 is utilized for collection of PL spectra as well as reflectance spectra in support of both the PL and reflectometry techniques described elsewhere herein.

In embodiments, the transfer chamber 130 further includes a reflectance apparatus. As shown in FIG. 1B, the collection fiber 141 coupling the spectrometer 143 to the transfer chamber 130 may be one terminal of a bifurcated fiber having a second terminal coupled to a white light source 145. The white light source may be of any type conventional in the art of reflectance measurement with the illumination fiber 144 penetrating the transfer chamber 130 to illuminate an area of a grown III-V film with light normal to the film's top surface. In the exemplary configuration depicted, the collection fiber 141 collects photoluminescence and reflected light normal to the film's surface in support of both PL and reflectometry techniques described elsewhere herein.

In an embodiment, the transfer chamber 130 includes an off-axis detector 148 to collect light scattered from the area of the III-V films illuminated by either the laser light source 140 or the white light source 145. The off-axis detector 148 is to provide an assessment of surface roughness and/or a measure of particles on the surface of a grown III-V film. Components of the reflectometer may be utilized to assess the surface roughness/particles. For example, while the reflectance system illuminates and analyzes along a direction normal to the wafer, the same illumination source will generate scattered light in other directions from a rough surface. Therefore, the roughness may be evaluated by collecting scattered light in an off-normal direction. The off-axis detector 148 may be of any type utilized in the art for such purposes, such as a CCD array. In an alternative embodiment, a video camera typically utilized for monitoring robotic handling within the transfer chamber 130 may be utilized as the off-axis detector 148 and operated for the additional purpose of collecting surface roughness and/or particle data in the epitaxially grown film.

In an embodiment, the transfer chamber 130 further includes a resistance meter, for example to measure a sheet resistivity of a doped film grown on the substrate 133 by one of the process chambers 102A,B,C. In a preferred embodiment, the resistance meter 150 is a contactless resistivity meter, such a microwave-reflectance system commercially available from Leighton, Inc. of Pennsylvania, U.S.A. Alternatively, a four point probe system utilizing spring loaded probes which contact the substrate 133 may also be fitted into the transfer chamber 130.

As further depicted in FIG. 1B, the cluster tool 110 includes an MQW band gap energy ($E_g$) estimator 153. The MQW $E_g$ estimator 153 may be implemented as software, hardware (e.g., as an ASIC or FPGA), or a combination of both. The MQW Eg estimator 153 is to access stored information, and to assess, from the metrology observations performed, the band gap of the MQW structure 162 (FIG. 1A) grown in one or more of the process chambers 102 A,B,C. Generally, the stored information accessed by the MQW $E_g$ estimator 153 may be in the form of a database, a look-up table (LUT), or a mathematical equation representing a theoretically or empirically modeled system. In a particular embodiment, the stored information includes information 154 containing band gap energy of at least one MQW structure determinable as a function of temperature, ($E_{g, MQW}(T)$) as well as information 155 containing band gap energy of at least one semiconductor base layer composition (e.g., GaN) determinable as a function of temperature, ($E_{g, base\ layer}(T)$). In further embodiments, the MQW band gap energy ($E_g$) estimator 153 also includes an absorbance analyzer 156 to determine a temperature from a reflectance spectrum, for example utilizing a band edge technique as further described elsewhere herein.

Figure 1C:
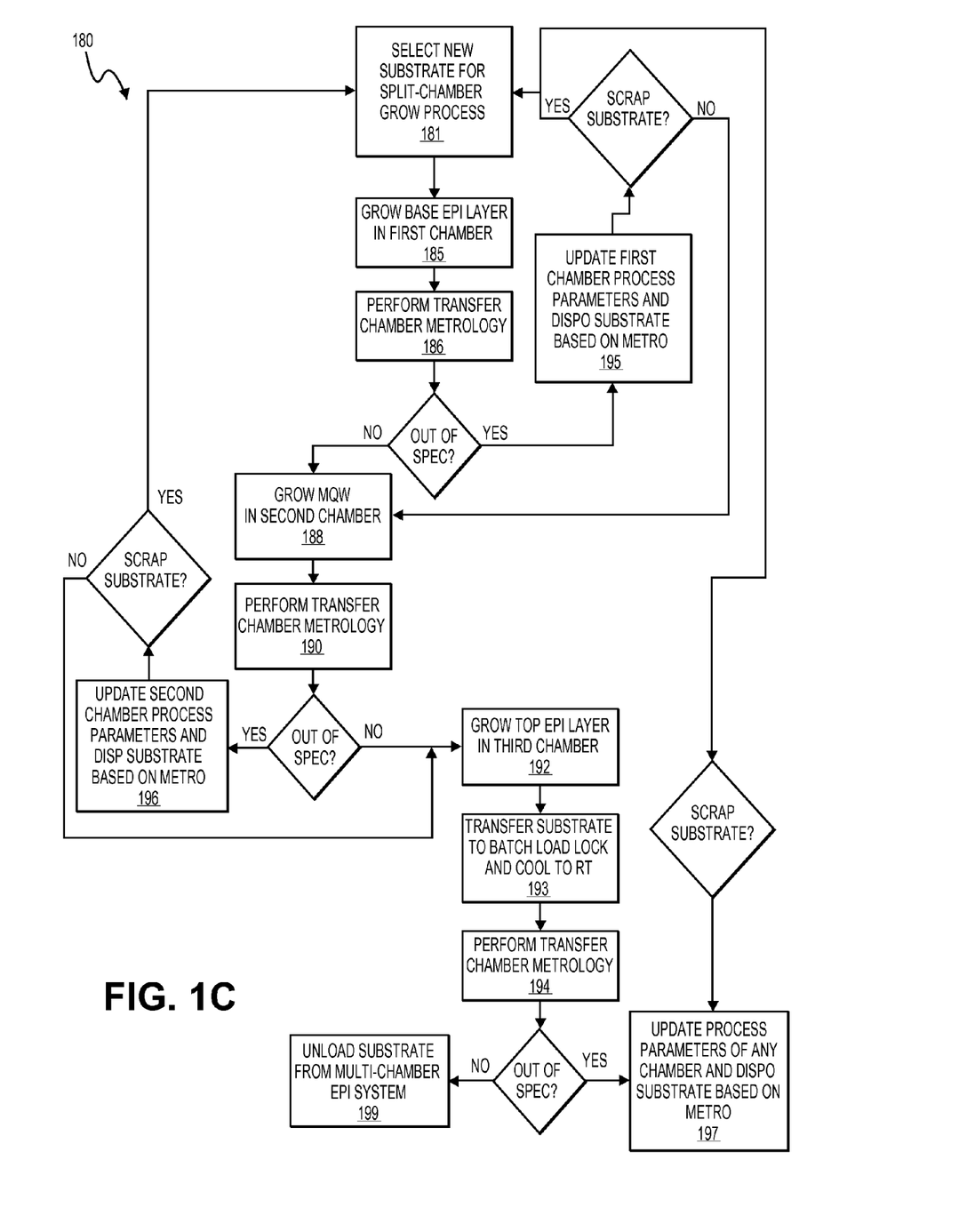
FIG. 1C is a flow diagram illustrating a method for epitaxial growth control, in accordance with an embodiment of the present invention.

FIG. 1C is a flow diagram illustrating a method 180 for epitaxial growth control, in accordance with an embodiment of the present invention in which a compound semiconductor structure, such as the LED stack 105 depicted in FIG. 1A, is fabricated using the processing system shown in FIG. 1B. The method 180 begins at operation 181 with selecting a new substrate for a split-chamber growth process. Generally, a split-chamber growth process entails a transfer between deposition chambers 102A,B,C during growth of a device material stack. For example, in reference to the LED stack 105, a split-chamber grow process includes three distinct growth segments: 1) growth of the n-type GaN base layer 158 in a first chamber, 2) growth of InGaN MQW structure 162 in a second chamber, and 3) growth of p-type AlGaN layer 163 in a third chamber. As shown in FIG. 1C, transfer chamber metrology may be applied during the breaks in epitaxial growth, for example to check whether the grown layers are of the proper structure/composition/doping/thickness/etc. During the split-chamber growth process, metrology may be performed in an automated fashion, incorporated as part of a transfer sequence between process chambers 102 A,B,C and performed under the vacuum/inert-environment of the transfer chamber 130. With a substrate 133 in a first process chamber (e.g., deposition chamber 102A), a semiconductor base layer (e.g., GaN base layer 158) is grown at operation 185. Generally, base layer growth is performed at an elevated temperature, for example exceeding 400° C.

Following growth of the semiconductor base layer, the substrate is transferred out of the first deposition chamber and into the transfer chamber 130. At operation 186, transfer chamber metrology is performed. Any of the measurement techniques described previously, such as, but not limited to, reflectometry, PL, resistivity, or surface roughness measurements may be performed at operation 186. In a particular embodiment, at least one of reflectance apparatus, resistance meter 150, and off-axis detector 148 are used to determine a film thickness, resistivity or surface roughness for the base layer grown in the first deposition chamber. In a particular embodiment, a transfer chamber metrology method 200, as further illustrated in FIG. 2, is performed at operation 186 to provide base layer growth process control based at least upon a base layer resistivity measurement.

Figure 2:
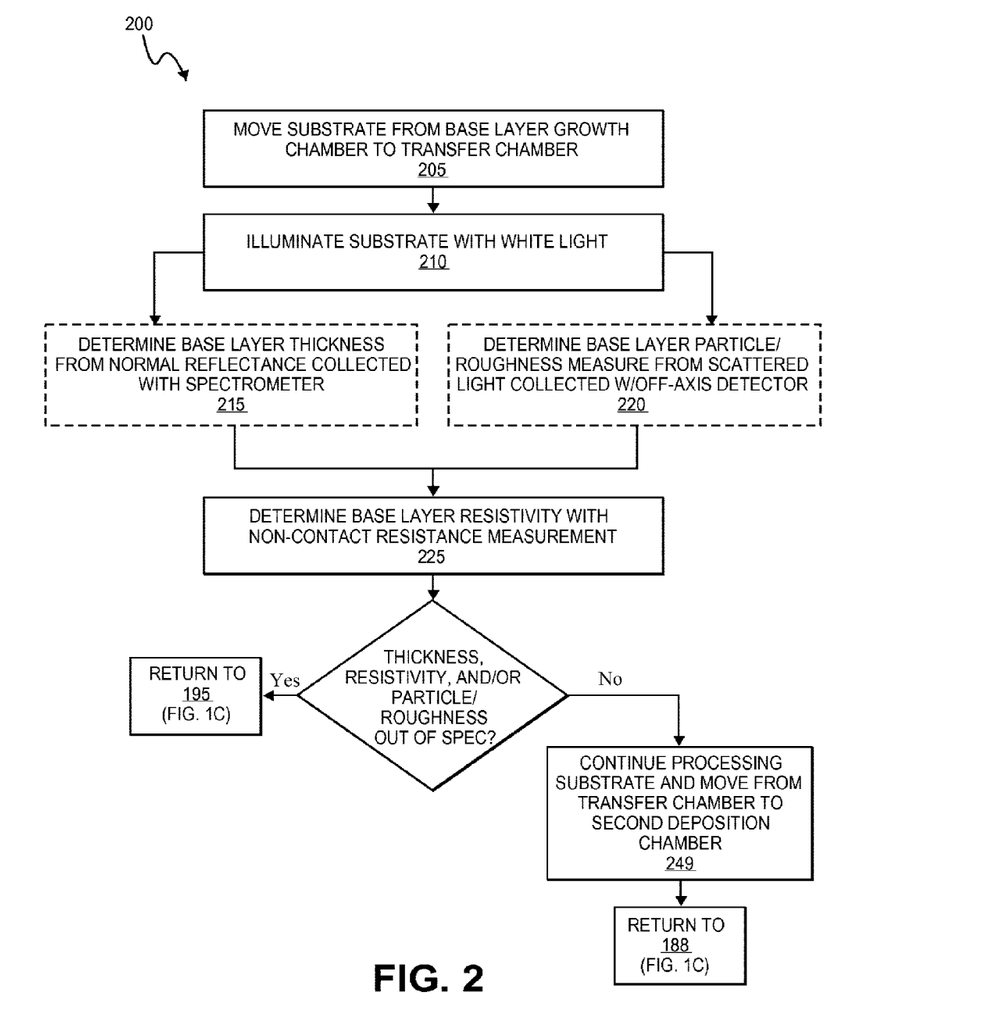
FIG. 2 is a flow diagram illustrating a method for measuring a thickness, particle and/or roughness, and resistivity of a semiconductor base layer in a transfer chamber of the cluster tool depicted in FIG. 1B, in accordance with an embodiment of the present invention.

Referring to FIG. 2, the transfer chamber metrology method 200 includes at least a sheet resistance measurement and may further include a surface roughness assessment, and a film thickness measurement of the base layer 158 grown in the deposition chamber 102A. At operation 205, the substrate 133 is moved from the base layer growth chamber to the transfer chamber 130. At operation 210, the substrate 133 is illuminated with white light. At operation 215, a film thickness of the base layer 158 is determined from reflectance normal to the film surface collected with the spectrometer 143. At operation 220, a particle and/or surface roughness assessment may be made concurrently with scattered white light collected with the off-axis detector 148. At operation 225, resistivity of the base layer 158 is determined with a non-contact resistance measurement at operation 225. Measured values are then compared with thresholds to determine if the measured film is outside of material specifications.

Where the transfer chamber metrology operation 186 indicates the processed substrate(s) 133 to be within specification, processing is continued at operation 249 with the substrate transferred into a second deposition chamber (e.g., deposition chamber 102B) where the transfer chamber metrology method 200 returns to operation 188 of FIG. 1C for growth of another III-V film over the base layer 158 (e.g., MQW structure 162).

Where the transfer chamber metrology operation 186 indicates the processed substrate(s) 133 to be outside specification, the transfer chamber metrology method 200 returns to operation 195 (FIG. 1C) where a process parameter of the first deposition chamber is updated to modify the process by which the base layer is grown on a subsequently processed substrate. For example, the system controller 161 may modify a growth duration for the semiconductor base layer of a subsequently processed substrate based on a thickness of the semiconductor base layer determined from the reflectance spectrum collected at operation 215. In other embodiments, the system controller 161 modifies a precursor partial pressure or growth duration for the semiconductor base layer of a subsequently processed substrate based on the sheet resistivity of the semiconductor base layer determined at operation 225. As such, a growth process control effort is exerted based on the transfer chamber metrology performed at operation 186. The substrate measured at operation 186 is further dispositioned at operation 195. If the substrate has been rendered unusable, further processing of the processed substrate(s) may be terminated with the carrier 114 placed back in the load lock to be unloaded for scrap or rework. Alternatively, further processing of the substrate 133 may proceed with perhaps reduced yield expected.

Figure 3A:
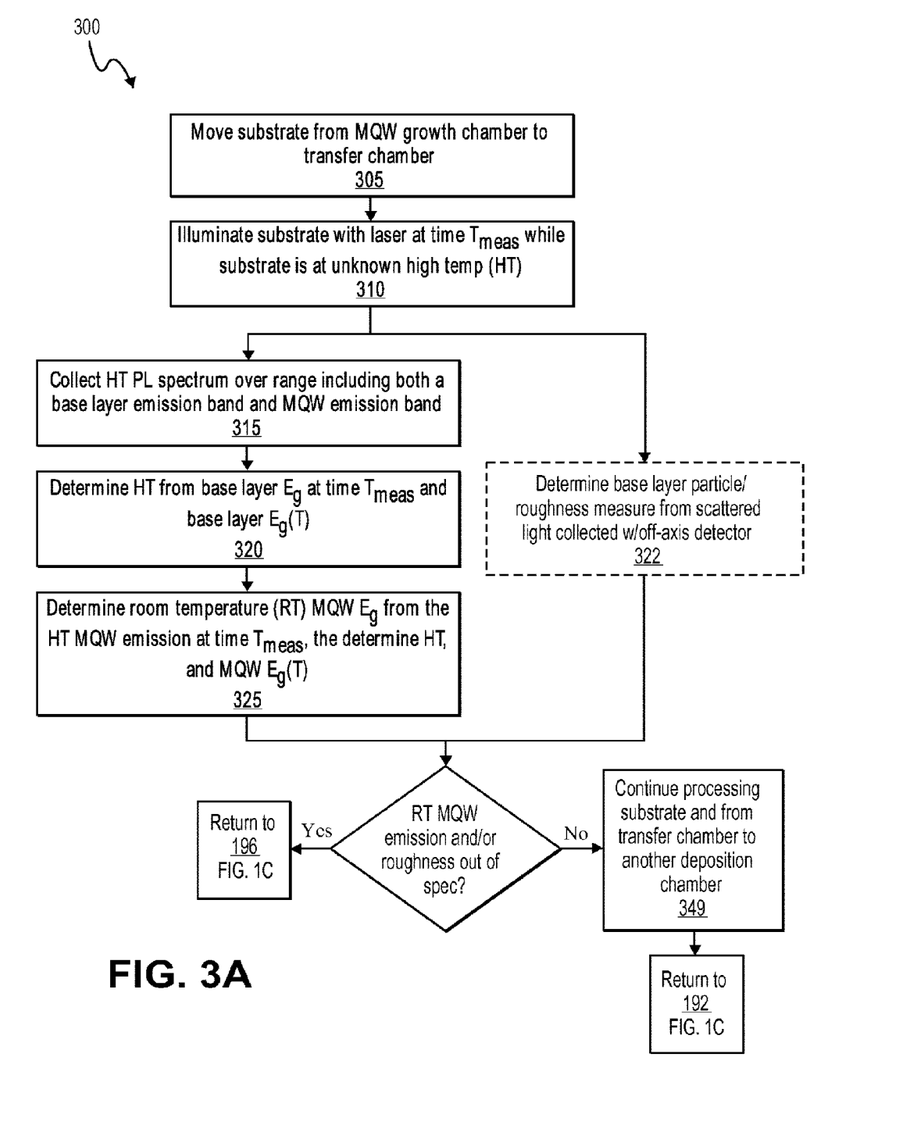
FIG. 3A is a flow diagram illustrating a method for measuring a band gap energy of a group III-V film on a substrate disposed in a chamber of the cluster tool depicted in FIG. 1B, in accordance with an embodiment of the present invention.
Figure 4A:
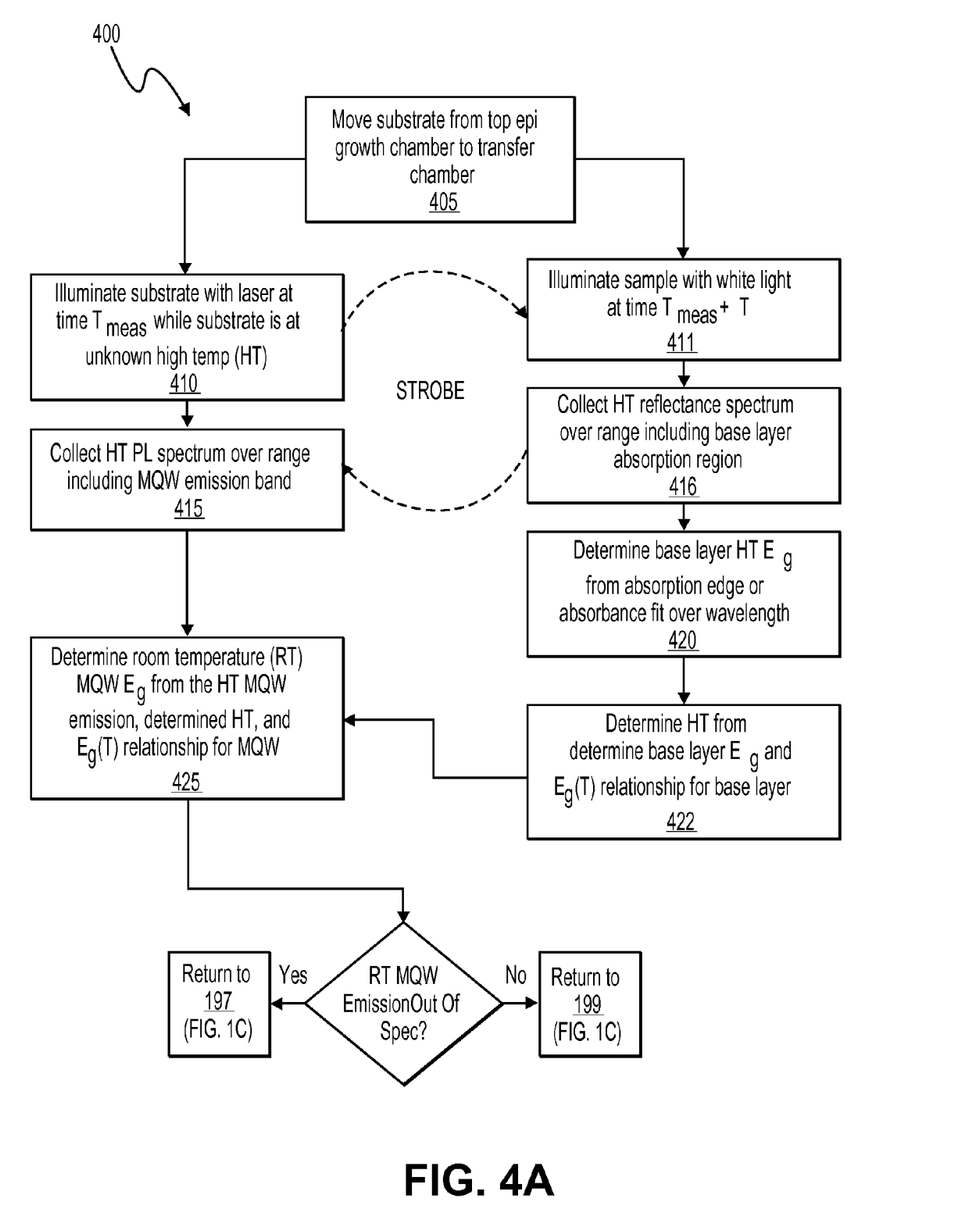
FIG. 4A is a flow diagram illustrating a method for measuring a band gap energy of a group III-V film on a substrate disposed in a chamber of the cluster tool depicted in FIG. 1B, in accordance with an embodiment of the present invention

Returning to FIG. 1C, at operation 188, the group III-V film is grown and the processed substrate(s) again removed to the transfer chamber 130. Generally, the growth operation 188 is performed at an elevated temperature, for example above 400° C. At operation 190, transfer chamber metrology is again performed, this time to characterize the III-V film grown in the second deposition chamber. Any of the measurement techniques described previously, such as, but not limited to, PL reflectometry, resistivity or surface roughness measurements may be performed at operation 190, depending on the type of III-V film grown at operation 188. In the exemplary embodiment where the MQW structure 162 is grown at operation 188, the transfer chamber metrology method 300 depicted in FIG. 3A is performed at operation 190 to provide MQW growth process control based at least upon a room temperature MQW $E_g$ estimate. In an alternative embodiment where the MQW structure 162 is grown at operation 188, the transfer chamber metrology method 400 depicted in FIG. 4A is performed at operation 190 to provide MQW growth process control based at least upon a room temperature MQW $E_g$ estimate. In still other embodiments, both the transfer chamber metrology methods 300 and 400 are performed at operation 190 to provide MQW growth process control based at least upon a room temperature MQW $E_g$ estimate.

Referring to FIG. 3A, the transfer chamber metrology method 300 includes at least a PL measurement and begins at operation 305 with moving the substrate(s) 133 from the MQW growth chamber to the transfer chamber 130. While in the transfer chamber 130, the substrate(s) 133 are illuminated by the laser light source 140 at time $\tau_{meas}$. Because the MQW structure 162 was grown at an elevated temperature, the substrate 133 is cooling from the process temperature while in the transfer chamber 130 and will be at an unknown high temperature (HT) at time $\tau_{meas}$. At operation 315, a PL spectrum is collected by the spectrometer 143 over a range including emission bands of both the base layer 158 and MQW structure 162.

Figure 3B:
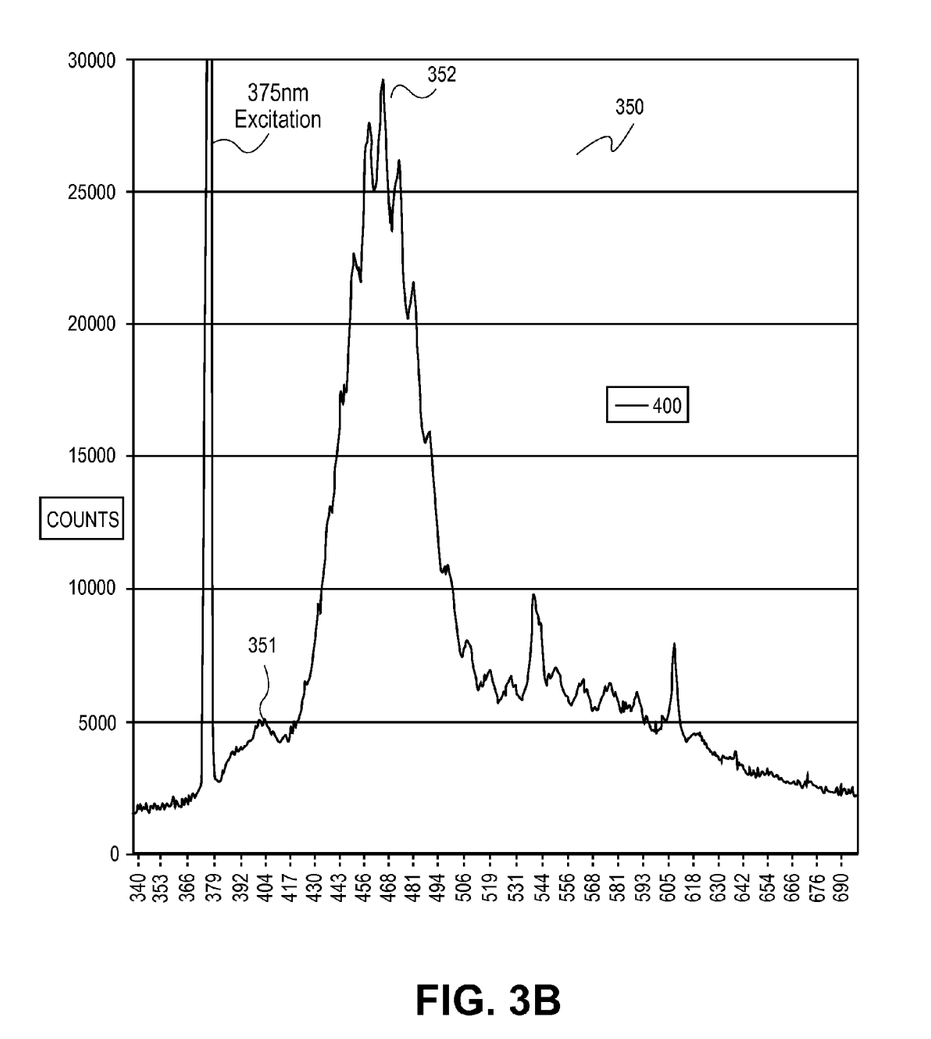
FIG. 3B is a PL spectra for the GaN-based LED film stack of FIG. 1A as excited by a 375 nm collimated laser light source while the substrate is at a high temperature, in accordance with an embodiment of the present invention.

An exemplary PL spectrum 350 for an embodiment where the base layer 158 is GaN and the MQW structure 162 includes InGaN is depicted in FIG. 3B. The PL spectrum 350 is in response to excitation by a 375 nm collimated laser light source having an average power of 15 mW. As depicted, with the substrate temperature elevated to the high temperature, the GaN base layer 158 and MQW structure 162 is photoluminescent with a base layer emission band 351 and a MQW emission band 352.

Figure 3C:
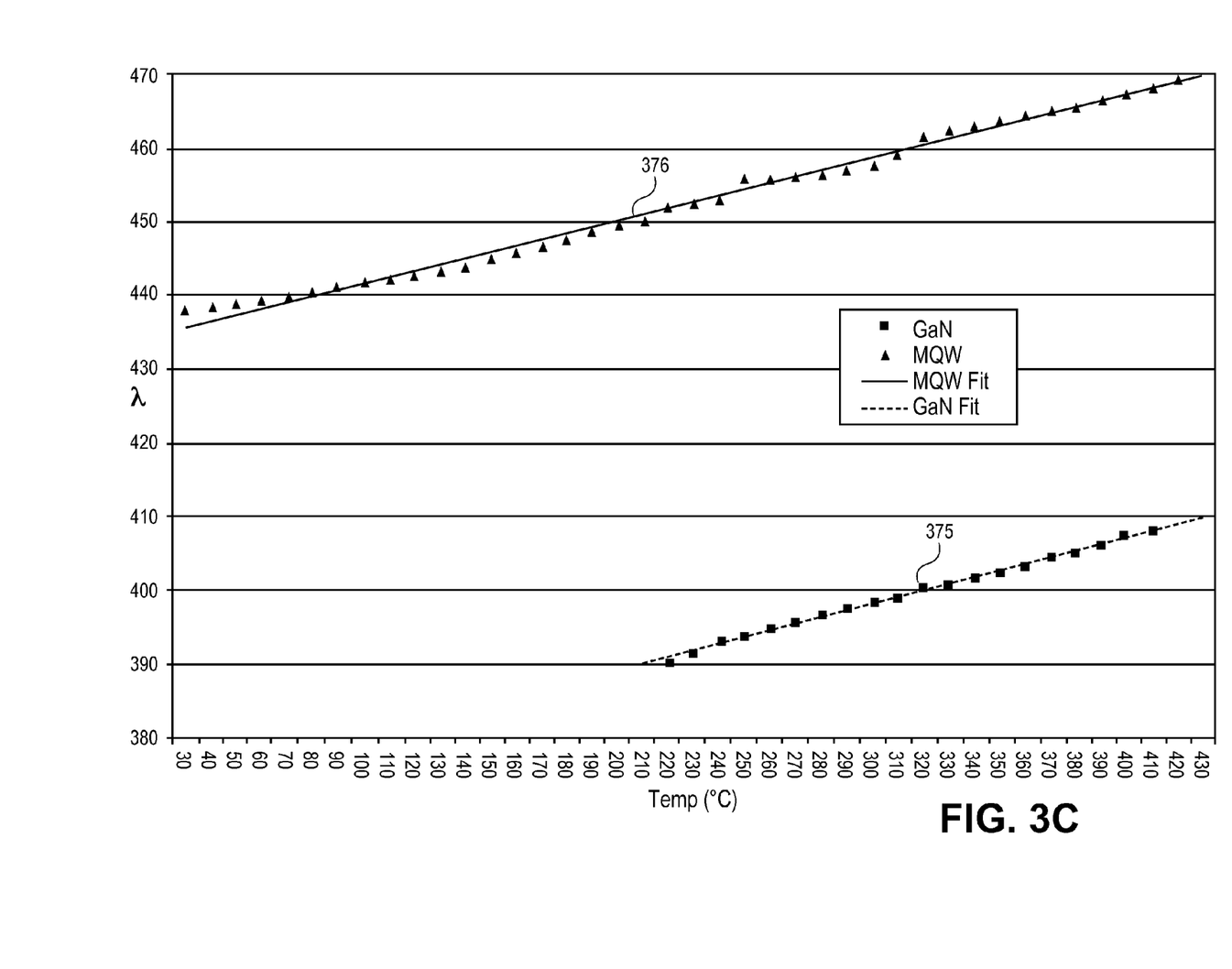
FIG. 3C are graphs of band gap energy of the group III-V film and of the semiconductor base layer as a function of temperature, in accordance with an embodiment of the present invention.

At operation 320, the substrate temperature at time $\tau_{meas}$ is determined from the band gap energy ($E_g$) observed for the base layer 158. Referring to FIG. 1B, the MQW Eg estimator 153 is to access the base layer $E_g(T)$ information 155 given that the base layer composition is a well-controlled parameter. For example, where the base layer 158 includes GaN, the base layer $E_g(T)$ information 155 contains band gap values of GaN as a function of temperature which can be described by Varshni's equation:

$$E_g(T) = E_g(0) - \frac{\alpha T^2}{T + \beta}$$

where $E_g(0)$, $\alpha$ and $\beta$ are material constants. Alternatively, the base layer $E_g(T)$ information 155 may be a fitted model derived for the particular base layer semiconductor. FIG. 3C depicts a graph 375 of measured band gap energy of a GaN base layer 158 as a function of temperature and a modeled fit of the measured energies which may be used to estimate the substrate temperature in accordance with an embodiment of the present invention. Thus, in embodiments, at operation 320, the substrate temperature at time $\tau_{meas}$ is estimated by first executing a standard peak detection algorithm to identify the peak of the base layer emission band 351, and then determining the temperature associated with the peak emission energy on the GaN $E_g(T)$ graph 375.

Returning to FIG. 3A, at operation 325, the room temperature MQW is determined based on the high temperature MQW emission band 352 and the substrate temperature estimated at operation 320. In the exemplary embodiment, a standard peak detection routine is executed on the MQW emission band 352 and by applying Varshni's equation, for example, with the estimate temperature the room temperature MQW may be determined. Alternatively, a number of MQW band energies associated with a temperature (Eg(T)) information 154 contained in a LUT is accessed by the MQW $E_g$ estimator 153 to determine the room temperature MQW. For example, FIG. 3C further depicts a graph 376 of measured band gap energy of an MQW structure 162 as a function of temperature and a modeled fit of the measured energies, in accordance with an embodiment of the present invention. Where the MQW Eg(T) information 154 contains a plurality of datasets with each set forming a graph 376, standard mathematical techniques may be performed to arrive at an estimate for the room temperature MQW $E_g$ from a LUT containing a LUT of $E_g(T)$ information for different MQW structures.

The estimated room temperature MQW $E_g$, or an estimated LED emission wavelength, is then utilized as a MQW growth process control parameter in the method 180. As such, the elevated temperature being sufficient to cause the base layer 158 to photoluminesce in addition to the MQW structure 162, allows a single PL measurement at time $\tau_{meas}$ to generate a reference with which the high temperature PL measurement of the MQW structure 162 is corrected into a useful growth control parameter having very short feedback delay (e.g., much shorter than waiting for the substrate to cool to room temperature and then performing a room temperature PL measurement).

As further illustrated in FIG. 3A, at operation 322, a particle and/or surface roughness assessment may also be made concurrently with scattered laser light collected with the off-axis detector 148. For embodiments where a patterned sapphire substrate is employed, the interface between the GaN base layer 158 and sapphire substrate 157 is intentionally rough. However, for embodiments where the laser light wavelength is sufficiently short to be absorbed by the GaN base layer 158 (e.g., 360-375 nm), the rough sapphire interface will not pose a problem for the surface roughness measurement when performed in the cluster tool 110 at the elevated temperature.

The estimated room temperature MQW $E_g$ values and/or surface roughness values are compared with thresholds to determine if the measured III-V film is outside of material specifications. Where the transfer chamber metrology method 300 indicates the processed substrate(s) 133 to be within specification, processing is continued with the transfer chamber metrology method 300 returning to operation 192 of FIG. 1C for growth of another III-V film (e.g., p-type top layer 163). Where the transfer chamber metrology method 300 indicates the processed substrate(s) 133 to be outside specification, the transfer chamber metrology method 300 returns to operation 196 (FIG. 1C) and a process parameter of the second deposition chamber is updated to modify the process by which the MQW structure 162 is to be grown on a subsequently processed substrate. For example in one embodiment the system controller 161 modifies a growth temperature for an MQW growth to be performed on a subsequently processed wafer in the second process chamber. As such, a growth control effort is exerted based on the transfer chamber metrology performed at operation 190. The substrate(s) 133 measured at operation 190 are further dispositioned at operation 196. If the substrate has been rendered unusable, further processing of the processed substrate(s) may be terminated with the carrier 114 placed back in the load lock for unloading. Alternatively, further processing may proceed with perhaps reduced yield expected.

Referring to FIG. 4A, the transfer chamber metrology method 400 includes at least a PL measurement and begins at operation 405 with moving the substrate(s) 133 from the MQW growth chamber to the transfer chamber 130. While in the transfer chamber 130, the substrate(s) 133 is illuminated by the laser light source 140 at time $\tau_{meas}$. Because the MQW structure 162 was grown at an elevated temperature, the substrate 133 is cooling from the process temperature while in the transfer chamber 130 and will be at an unknown high temperature (HT) at time $\tau_{meas}$. At operation 415, a high temperature PL spectrum is collected by the spectrometer 143 over a range including emission band of the MQW structure 162. At operation 411, the substrate is illuminated by the white light source 145 at time $\tau_{meas}+\Delta T$ and at operation 416 a high temperature reflectance spectrum is collected by the spectrometer 143 over a range including a semiconductor base layer absorption region. Generally, because each of the operations 410, 415, 411 and 416 can be performed in less than a few seconds, $\Delta T$ is very small and the two measurement spectrums collected at operation 415 and 416 may be assumed to be taken at the same time or the operations 410, 415, 411 and 416 strobed to generate a statistic of a plurality of spectrums (e.g., averaged HT PL spectrum and averaged HT reflectance spectrum), if desired.

Figure 4B:
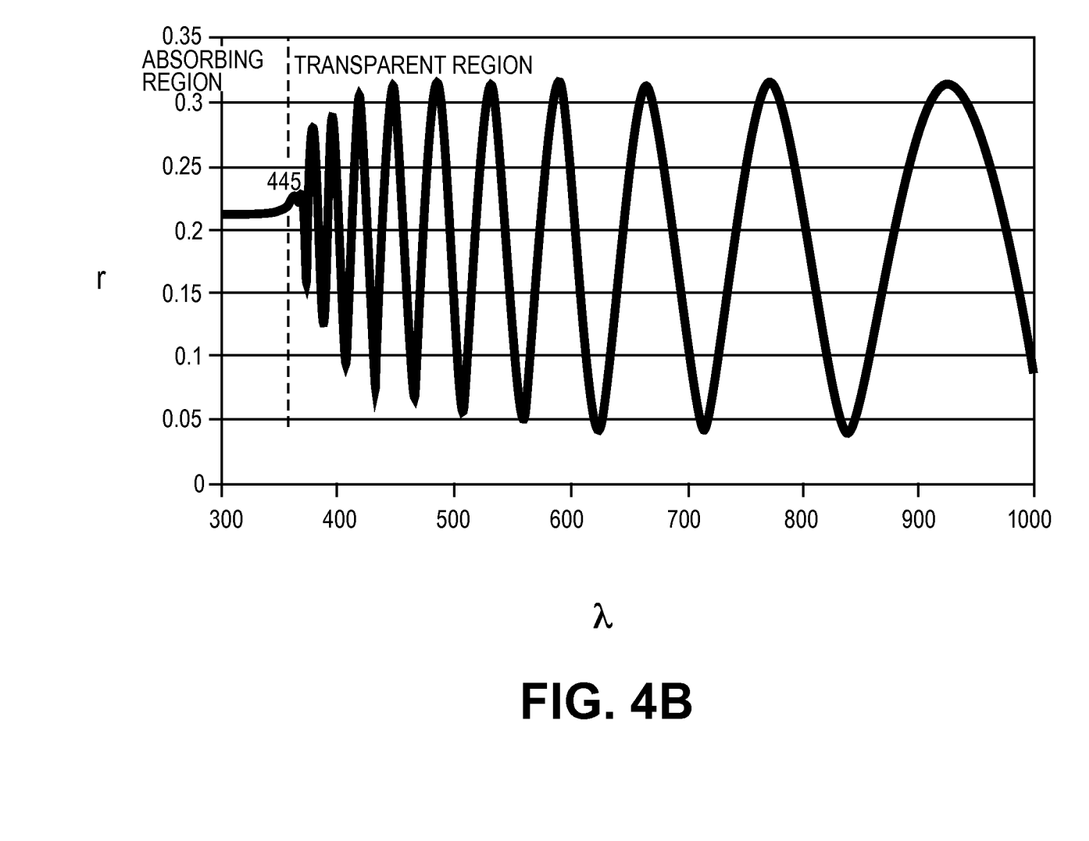
FIG. 4B is a graph of a white light reflectance spectrum of a semiconductor base layer measured in a chamber of the cluster tool depicted in FIG. 1B, in accordance with an embodiment of the present invention.

At operation 420, the base layer band gap energy $E_g$ is determined from an absorption edge technique. For the absorption edge technique, when a semiconductor crystal is illuminated by polychromatic light, there is a sharp increase in photon absorption when the photon energy is greater than the semiconductor crystal band-gap energy. For example, FIG. 4B depicts a graph of a white light reflectance spectrum of a 4 μm thick GaN semiconductor base layer 158 on a sapphire substrate, in accordance with an embodiment of the present invention. As shown, the absorption edge 445 separates the absorbing and transparent regions of the spectrum. The photon wavelength which corresponds to the band-gap energy is known as the band-edge wavelength and this wavelength is temperature dependent. Since the semiconductor crystal band-gap energy is inversely related to the lattice constant, the band-gap energy will decrease as the semiconductor crystal expands with increasing temperature and so the band-edge wavelength will increase. As such, the absorbance analyzer 156 can estimate the high temperature band gap energy $E_g$ of the base layer at operation 420 based on the reflectivity spectrum collected at operation 415 using known spectral analysis techniques.

At operation 422, the substrate temperature at time $\tau_{meas}$ (or $\tau_{meas}+\Delta T$) is determined from the band gap energy ($E_g$) determined for the base layer 158. Referring to FIG. 1B, the MQW $E_g$ estimator 153 accesses the base layer $E_g(T)$ information 155 and because the base layer composition should be well-controlled an accurate estimate of the temperature may be made. For example, where the base layer 158 is GaN, the base layer $E_g(T)$ information 155 contains band gap values of GaN as a function of temperature (e.g., Varshni's equation) and the elevated (high) temperature can be estimated by the MQW estimator 153. Alternatively, the base layer $E_g(T)$ information 155 may be a fitted model derived for the particular base layer semiconductor. Band gap energy graph of a GaN base layer 158 as a function of temperature and a modeled fit of the measured energies depicted in FIG. 3B can also be utilized.

Returning to FIG. 4A, at operation 425, the room temperature MQW is determined based on the high temperature MQW emission and the substrate temperature estimated at operation 422. In the exemplary embodiment, a standard peak detection routine is executed on the MQW emission band and by applying Varshni's equation, for example, with the estimated substrate temperature, the room temperature MQW $E_g$ may be determined. Alternatively, a number of datasets, each having band energies associated with temperature (Eg(T)) for a particular MQW structure, contained in a LUT is accessed by the MQW $E_g$ estimator 153 to determine the room temperature MQW $E_g$. For example, where the MQW Eg(T) information 154 contains a plurality of graphs like the graph 376 (FIG. 3C), standard mathematical techniques may be performed to arrive at an estimate for the room temperature MQW $E_g$.

The estimated room temperature MQW $E_g$ is then the basis for a MQW growth process control parameter in the method 180. As such, the high temperature PL measurement of the MQW structure 162 is corrected into a useful growth control parameter having very short feedback delay (e.g., much shorter than waiting for the substrate to cool to room temperature and then performing a room temperature PL measurement). The estimated room temperature MQW $E_g$ value is compared with thresholds to determine if the measured III-V film is outside of material specifications. Where the transfer chamber metrology method 400 indicates the processed substrate(s) 133 to be within specification, processing is continued with the transfer chamber metrology method 300 returning to operation 192 of FIG. 1C for growth of another III-V film (e.g., p-type layer 163). Where the transfer chamber metrology method 400 indicates the processed substrate(s) 133 to be outside specification, the transfer chamber metrology method 400 returns to operation 196 (FIG. 1C) where a process parameter of the second deposition chamber is updated to modify the process by which the MQW layer is to be grown on a subsequently processed substrate.

Returning to FIG. 1C, at operation 192 another III-V film is grown on the substrate 133 in a third deposition chamber. In the exemplary embodiment, the p-type layer 163 is grown in the process chamber 102C. Following the film growth, the substrate(s) 133 are transferred into a load lock where they may cool while other substrates are processed through the operations illustrated in FIG. 1C. In an embodiment, following cooling to at or near room temperature, the substrate(s) 133 is moved back from the load lock into the transfer chamber and a final transfer chamber metrology is performed at operation 194. Such in-situ room temperature metrology has the advantage of being faster than waiting for a full lot to complete processing on the cluster tool 110, complete venting of the load lock, and complete loading a substrate onto a stand-alone metrology tool. Any of the transfer chamber measurement techniques described for the operations 186 and 188 may be performed at operation 194. For example, in one embodiment, a room temperature PL measurement is performed to verify the room temperature MQW $E_g$ is in agreement with the temperature corrected room temperature $E_g$ estimate determined at operation 190 (e.g., via either method 300 or method 400).

Where the processed substrate(s) 133 is outside specification at operation 194, a process parameter of the second deposition chamber is updated at operation 197 to modify the process by which the MQW structure 162 is to be grown on a subsequently processed substrate. For example, in one embodiment the system controller 161 modifies a growth temperature for an MQW growth to be performed on a subsequently processed wafer in the second process chamber. As such, a control effort is exerted based on the transfer chamber metrology performed at operation 194. The substrate(s) 133 measured at operation 194 are further dispositioned at operation 197. If the substrate has been rendered unusable, further processing of the processed substrate(s) may be terminated with the carrier 114 placed back in the load lock for scrap or rework. Alternatively, the substrate may be placed back in the load lock and unloaded from the cluster tool 110 for subsequent patterning and/or metallization.

Figure 5:
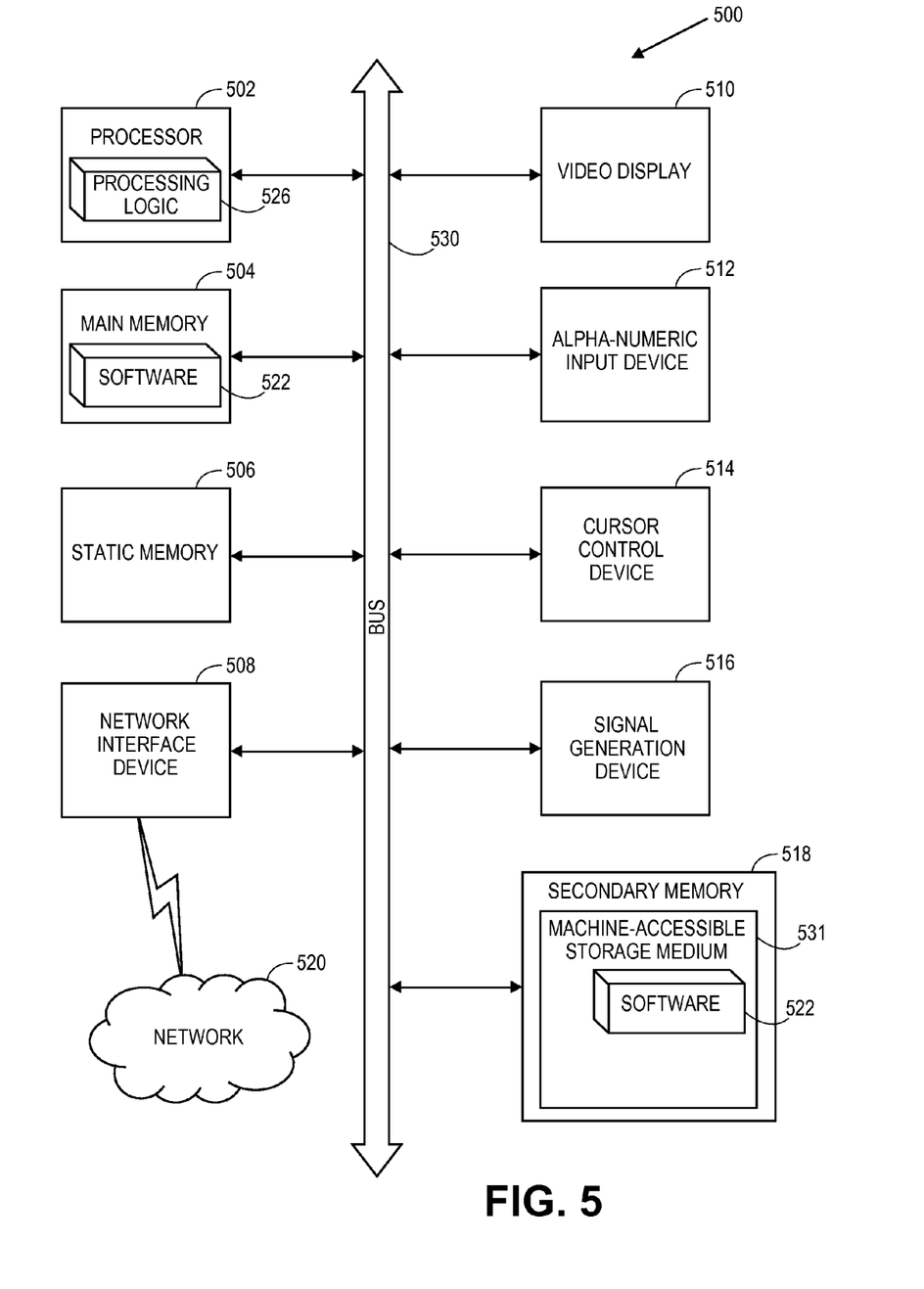
FIG. 5 is a schematic of a computer system, in accordance with an embodiment of the present invention.

FIG. 5 illustrates a diagrammatic representation of a machine in the exemplary form of a computer system 500 which may be utilized as the system controller 161 to control one or more of the operations, process chambers or multi-chambered processing platforms described herein. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC) or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies discussed herein.

The exemplary computer system 500 includes a processor 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a secondary memory 518 (e.g., a data storage device), which communicate with each other via a bus 530.

The processor 502 represents one or more general-purpose processing devices such as a microprocessor, central processing unit, or the like. More particularly, the processor 502 may be a complex instruction set computing (CISC) microprocessor, reduced instruction set computing (RISC) microprocessor, very long instruction word (VLIW) microprocessor, processor implementing other instruction sets, or processors implementing a combination of instruction sets. The processor 502 may also be one or more special-purpose processing devices such as an application specific integrated circuit (ASIC), a field programmable gate array (FPGA), a digital signal processor (DSP), network processor, or the like. The processor 502 is configured to execute the processing logic 526 for performing the process operations discussed elsewhere herein.

The computer system 500 may further include a network interface device 508. The computer system 500 also may include a video display unit 510 (e.g., a liquid crystal display (LCD) or a cathode ray tube (CRT)), an alphanumeric input device 512 (e.g., a keyboard), a cursor control device 514 (e.g., a mouse), and a signal generation device 516 (e.g., a speaker).

The secondary memory 518 may include a machine-accessible storage medium (or more specifically a computer-readable storage medium) 531 on which is stored one or more sets of instructions (e.g., software 522) embodying any one or more of the methods or functions described herein. The software 522 may also reside, completely or at least partially, within the main memory 504 and/or within the processor 502 during execution thereof by the computer system 500, the main memory 504 and the processor 502 also constituting machine-readable storage media.

The machine-accessible storage medium 531 may further be used to store a set of instructions for execution by a processing system and that cause the system to perform any one or more of the embodiments of the present invention. Embodiments of the present invention may further be provided as a computer program product, or software, that may include a machine-readable storage medium having stored thereon instructions, which may be used to program a computer system (or other electronic devices) to perform a process according to the present invention. A machine-readable storage medium includes any mechanism for storing information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, and other such non-transitory storage media known in the art.

It is to be understood that the above description is intended to be illustrative, and not restrictive. Many other embodiments will be apparent to those of skill in the art upon reading and understanding the above description. Although the present invention has been described with reference to specific exemplary embodiments, it will be recognized that the invention is not limited to the embodiments described, but can be practiced with modification and alteration. Accordingly, the specification and drawings are to be regarded in an illustrative sense rather than a restrictive sense.

What is claimed is:

1. A system for epitaxially growing a group III-V film on a substrate, the system comprising:
   a deposition chamber to grow the group III-V film;
   a transfer chamber coupled to the deposition chamber;
   a laser light source coupled to the transfer chamber to illuminate an area of the group III-V film while the substrate is disposed in the transfer chamber at a first temperature, greater than room temperature;
   a spectrometer coupled to the transfer chamber to collect an emission spectrum from the illuminated area; and
   a system controller coupled to the transfer chamber to determine an estimate of the first temperature based on the collected emission spectrum and to estimate a room temperature band gap energy of the group III-V film based on the estimated temperature.

2. The system of claim 1, wherein the laser light source is to illuminate, through a window in the transfer chamber, the group III-V film with a collimated beam.

3. The system of claim 2, wherein the laser light source is to illuminate a spot size on the group III-V film of between 25 and 2000 μm.

4. The system of claim 1, wherein the laser light source is to illuminate the area of the III-V film with light incident to a top surface of the III-V film, and wherein the spectrometer is coupled to the transfer chamber via a collection fiber penetrating the transfer chamber to collect light normal to the top surface of the III-V film.

5. The system of claim 1, wherein the laser light source emits at a wavelength which is absorbed by a semiconductor base layer disposed below the III-V film when at the first temperature.

6. The system of claim 5, wherein the laser light source emits at a wavelength of at least 375 nm.

7. The system of claim 5, wherein the spectrometer records spectra over a range including emission bands from both the semiconductor base layer and the III-V film.

8. The system of claim 7, further comprising a database containing first information associating the band gap energy of the semiconductor base layer with temperature, and wherein the controller is to estimate the first temperature based on the semiconductor base layer emission band.

9. The system of claim 8, further comprising a database containing second information associating the band gap energy of the group III-V film with temperature, and wherein the controller is to access the second information to determine the band gap energy of the group III-V film at room temperature.

10. The system of claim 1, wherein the controller is to modify a growth temperature at which the group III-V film is to be grown on a subsequently processed substrate based on the determined band gap energy of the group III-V film.

11. The system of claim 1, further comprising an off-axis detector to collect light reflected from the illuminated area of the III-V film.

12. The system of claim 1, further comprising a white light source coupled to the transfer chamber to illuminate an area of the group III-V film while the substrate is disposed in the transfer chamber at the first temperature, and wherein the spectrometer is to collect a reflectance spectrum from the illuminated area over a wavelength range including wavelengths absorbed by a semiconductor base layer disposed below the III-V film.

13. The system of claim 12, wherein the controller is to estimate the first temperature based on an absorbance edge determined from the reflectance spectrum.

14. The system of claim 13, wherein the controller is to modify a duration of a semiconductor base layer growth performed on a subsequent substrate based on a thickness of the semiconductor base layer determined from the reflectance spectrum.

15. The system of claim 12, wherein the white light source and spectrometer are coupled to the transfer chamber with a bifurcated optical fiber having a first end fitted into the transfer chamber, a second end fitted to the white light source and a third end fitted to the spectrometer.

* * * * *